United States Patent [19]
Tani

[11] Patent Number: 6,048,776
[45] Date of Patent: Apr. 11, 2000

[54] SEMICONDUCTOR DEVICE AND A METHOD OF FABRICATING THE SAME

[75] Inventor: Tomofune Tani, Tokyo, Japan

[73] Assignee: United Microelectronics, Hsinchu, Taiwan

[21] Appl. No.: 09/161,316

[22] Filed: Sep. 28, 1998

Related U.S. Application Data

[62] Division of application No. 08/848,289, Apr. 29, 1997, Pat. No. 5,872,392.

[30] Foreign Application Priority Data

Apr. 30, 1996 [JP] Japan .................................. 8-132883

[51] Int. Cl.⁷ .......................... H01L 23/58; H01L 21/425
[52] U.S. Cl. ......................... 438/433; 438/430; 438/286; 257/630; 257/330
[58] Field of Search .................................. 438/286, 430, 438/433; 257/630, 330

[56] References Cited

U.S. PATENT DOCUMENTS

| | | | |
|---|---|---|---|
| 4,639,288 | 1/1987 | Price et al. | 438/433 |
| 4,766,090 | 8/1988 | Coquin et al. | 438/433 |
| 4,840,920 | 6/1989 | Suda | 438/433 |
| 5,258,635 | 11/1993 | Nitayama et al. | 257/330 |
| 5,293,055 | 3/1994 | Hara et al. | 257/371 |
| 5,410,176 | 4/1995 | Liou et al. | 257/513 |
| 5,436,189 | 7/1995 | Beasom | 438/433 |
| 5,578,509 | 11/1996 | Fujita | 438/286 |

FOREIGN PATENT DOCUMENTS

| | | |
|---|---|---|
| 1-245540 | of 1989 | Japan . |
| 3-290950 | of 1991 | Japan . |
| 5-109886 | of 1993 | Japan . |
| 6-291181 | of 1994 | Japan . |

OTHER PUBLICATIONS

Stanley Wolf Silicon Processing for the VSLI Era vol. I Lattice press pp. 306–307, 1986.
Stanley Wolf Silicon Processing for the VSLI Era vol. II Lattice press pp. 48,52,54–56, 62, 1990.
Stanley Wolf Silicon Processing for the VSLI Era vol. 2 lattice press pp. 238–239, 1990.

*Primary Examiner*—Charles Bowers
*Assistant Examiner*—David S Blum
*Attorney, Agent, or Firm*—Pollock, Vande Sande & Amernick

[57] ABSTRACT

A method of fabricating a semiconductor device, comprises the steps of forming a trench in a semiconductor substrate by using a selective etching process; forming an insulating layer at least on the inner surface of the trench; forming a film containing silicon at least on the insulation layer in the trench and doping a first impurity of a first conductivity type by a first ion implantation to a predetermined depth of the semiconductor substrate at least through the film containing silicon, and wherein the first impurity doped into the semiconductor substrate by the first ion implantation is at a level deeper than the bottom of the trench.

18 Claims, 14 Drawing Sheets

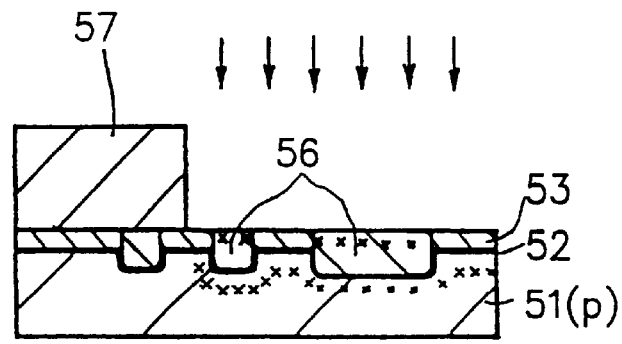
F I G. 2E
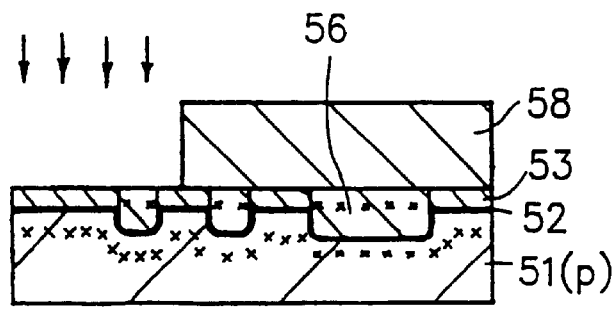
F I G. 2F
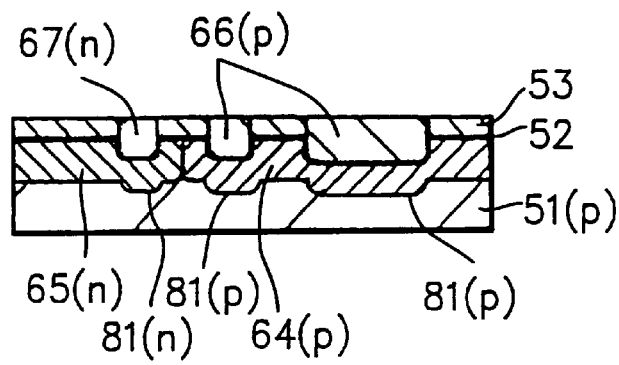
F I G. 2G
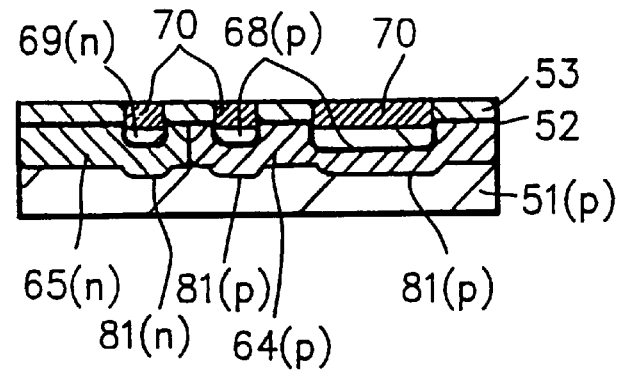
F I G. 2H

SEMICONDUCTOR DEVICE AND A METHOD OF FABRICATING THE SAME

This application is a divisional of Application Ser. No. 08/848,289 filed Apr. 29, 1997, now U.S. Pat. No. 5,872,392.

BACKGROUND OF THE INVENTION

1. Field of the Invention

The present invention relates to a semiconductor device having a buried field-shield element isolation structure or a buried gate electrode and a method of fabricating the same.

2. Description of the Related Art

As the miniaturization of elements advances in semiconductor devices such as LSIs, a field-shield element isolation technology by which a shield-plate electrode is buried in a silicon oxide film has been proposed as an element isolation technology replacing a LOCOS process, in order to decrease the size transformation errors. As field-shield element isolation structures formed by this element isolation technology, a so-called planar structure formed on a silicon substrate and a trench structure in which an element isolation region is formed in a substrate are being studied. An example of an element isolation technology for forming a planar field-shield element isolation structure is disclosed in Japanese Patent Laid-Open No. 6-291181. An example of an element isolation technology for forming a trench field-shield element isolation structure is disclosed in Japanese Patent Laid-Open No. 5-109886.

In a planar field-shield element isolation structure, a shield-gate oxide film and a shield-plate electrode are patterned on a silicon substrate. A cap oxide film and a side-wall protective film are formed to cover the shield-plate electrode.

In a trench field-shield element isolation structure, a shield-plate electrode surrounded by a shield-gate oxide film and a cap oxide film is buried in a trench formed in a silicon substrate.

Note that a semiconductor device in which an element isolation structure is not a field-shield element isolation structure but is formed by burying a trench formed in a silicon substrate with an insulator is disclosed in Japanese Patent Laid-Open No. 1-245540. In this Japanese Patent Laid-Open No. 1-245540, a well is formed by doping an impurity into a silicon substrate in which an insulator is buried in a trench.

In the field-shield element isolation structure disclosed in Japanese Patent Laid-Open No. 6-291181, after the cap oxide film and the side-wall protective film for covering the shield-plate electrode are formed, an impurity is ion-implanted into this field-shield element isolation structure. Consequently, an impurity diffusion layer is formed in the silicon substrate immediately below the shield-gate oxide film, and the ion-implanted impurity distributes in a deep portion of the silicon substrate in an element formation region. Accordingly, the element isolation capability can be improved by the impurity diffusion layer without adversely affecting an element such as a transistor formed in the element formation region.

Also, in the field-shield element isolation structure disclosed in Japanese Patent Laid-Open No. 5-109886, both a shield-plate electrode formed in a p-well region and a shield-plate electrode formed in an n-well region are of an n type. Therefore, in the p-well region, the work function difference between the n-type shield-plate electrode and the p-well diffusion layer below the electrode is large. This decreases the threshold voltage of a parasitic transistor formed in that portion. To avoid this, in the structure disclosed in Japanese Patent Laid-Open No. 5-109886, an enhancement p-type diffusion layer is formed around the trench in the p-well region.

In the above trench structure, however, it is necessary to perform oblique ion implantation or the like to particularly reliably dope a p-type impurity into the side walls of the trench to form the enhancement p-type diffusion layer. This complicates the fabrication process.

On the other hand, Japanese Patent Laid-Open No. 3-290950 discloses that the problem of the work function difference in the p-well region is solved by the use of an n-type shield-plate electrode in the n-well region and a p-type shield plate electrode in the p-well region, and that this obviates the need for enhancement impurity implantation in the p-well region. Unfortunately, the field-shield element isolation structure disclosed in this Japanese Patent Laid-Open No. 3-290950 is not a buried type trench structure but a conventional planar field-shield element isolation structure formed on a substrate.

SUMMARY OF THE INVENTION

It is the first object of the present invention to provide a semiconductor device fabrication method capable of easily forming a buried field-shield element isolation structure in which an n-type shield-plate electrode is used in an n-well region and a p-type shield-plate electrode is used in a p-well region. It is the second object of the present invention to provide a semiconductor device fabrication method capable of easily forming a buried gate electrode structure in which an n-type gate electrode is used in an n-well region and a p-type gate electrode is used in a p-well region. It is the third object of the present invention to provide a semiconductor device fabrication method capable of easily forming a planar field-shield element isolation structure in which an n-type shield-plate electrode is used in an n-well region and a p-type shield-plate electrode is used in a p-well region.

A semiconductor device of the present invention comprises a well region of a predetermined conductivity type which is formed in a surface region of a semiconductor substrate and in which at least a portion is formed to be deeper than a surrounding portion thereof, a first insulating film for covering inner walls of a trench formed in the well region of the semiconductor substrate, and a conductive film buried in the trench over the first insulating film.

A semiconductor device according to another aspect of the present invention comprises a pair of well regions of different conductivity types formed adjacent to each other in a surface region of a semiconductor substrate, a first insulating film for covering inner walls of a trench formed in each of the pair of well regions of the semiconductor substrate, and a conductive film buried in each of the trenches over the first insulating film, wherein in each of the pair of well regions, at least a portion is formed to be deeper than a surrounding portion thereof.

A method of fabricating a semiconductor device of the present invention comprises the steps of forming a silicon nitride film on a silicon semiconductor substrate over a first silicon oxide film and patterning the silicon nitride film into a predetermined shape, forming a trench in the silicon semiconductor substrate by using the silicon nitride film as an etching mask, forming a second silicon oxide film on inner surfaces of the trench by using the silicon nitride film as a mask, and forming a polysilicon film on an entire surface including the trench. The next steps comprise doping a first impurity of a first conductivity type to a predetermined depth of the silicon semiconductor substrate through the polysilicon film by first ion implantation and doping a second impurity of the first conductivity type into the polysilicon film by second ion implantation. Next the first and second impurities are activated by annealing, thereby forming a substrate region of the first conductivity type in the silicon semiconductor substrate and making the polysilicon film have the first conductivity type. The following steps comprise substantially completely removing the polysilicon film from the silicon nitride film and partially removing the polysilicon film from the trench until an upper surface of the polysilicon film becomes lower than a surface of the silicon semiconductor substrate, forming a third silicon oxide film on the polysilicon film remaining in the trench, and removing the silicon nitride film.

A method of fabricating a semiconductor device according to another aspect of the present invention comprises the steps of forming a silicon nitride film on a silicon semiconductor substrate over a first silicon oxide film and patterning the silicon nitride film into a predetermined shape, forming trenches in the silicon semiconductor substrate by using the silicon nitride film as an etching mask, forming a second silicon oxide film on inner surfaces of each of the trenches by using the silicon nitride film as a mask, forming a polysilicon film on an entire surface including the trenches, and forming a first resist film so as to cover a predetermined region of the polysilicon film. The next steps comprise doping a first impurity of a first conductivity type to a predetermined depth of the silicon semiconductor substrate through the polysilicon film by first ion implantation using the first resist film as a mask, doping a second impurity of the first conductivity type into the polysilicon film by second ion implantation using the first resist film as a mask, removing the first resist film and forming a second resist film so as to cover at least a region not covered with the first resist film, doping a third impurity of a second conductivity type to a predetermined depth of the silicon semiconductor substrate through the polysilicon film by third ion implantation using the second resist film as a mask, and doping a fourth impurity of the second conductivity type into the polysilicon film by fourth ion implantation using the second resist film as a mask. Following these steps the removing said second resist film is removed and the first to fourth impurities are activated by annealing, thereby forming a first substrate region of the first conductivity type and a second substrate region of the second conductivity type in said silicon semiconductor substrate. The next steps comprise making a portion of said polysilicon film in the upper side of the first substrate region have the first conductivity type, and making a portion of the polysilicon film in the upper side of the second substrate region have the second conductivity type, substantially completely removing the polysilicon film from the silicon nitride film and partially removing the polysilicon film from each of the trenches until an upper surface of the polysilicon film becomes lower than a surface of the silicon semiconductor substrate, forming a third silicon oxide film on the polysilicon film remaining in each of the trenches, and removing the silicon nitride film.

A method of fabricating a semiconductor device according to still another aspect of the present invention comprises the steps of forming a silicon nitride film on a silicon semiconductor substrate over a first silicon oxide film and patterning the silicon nitride film into a predetermined shape, forming a trench in the silicon semiconductor substrate by using the silicon nitride film as an etching mask, forming a second silicon oxide film on inner surfaces of the trench by using the silicon nitride film as a mask, forming a polysilicon film on an entire surface including said trench. The next steps comprise planarizing the polysilicon film by using the silicon nitride film as a stopper, doping a first impurity of a first conductivity type to a predetermined depth of the silicon semiconductor substrate through the polysilicon film or the silicon nitride film by first ion implantation, doping a second impurity of the first conductivity type into the polysilicon film by second ion implantation, activating the first and second impurities by annealing, thereby forming a substrate region of the first conductivity type in the silicon semiconductor substrate and making the polysilicon film have the first conductivity type. The next steps include partially removing the polysilicon film until an upper surface of the polysilicon film existing in the trench becomes lower than a surface of the silicon semiconductor substrate, forming a third silicon oxide film on said polysilicon film remaining in said trench, and removing said silicon nitride film.

A method of fabricating a semiconductor device according to still another aspect of the present invention comprises the steps of forming a silicon nitride film on a silicon semiconductor substrate over a first silicon oxide film and patterning the silicon nitride film into a predetermined shape, forming trenches in the silicon semiconductor substrate by using the silicon nitride film as an etching mask, forming a second silicon oxide film on inner surfaces of each of the trenches by using the silicon nitride film as a mask, forming a polysilicon film on an entire surface including the trenches, and planarizing said polysilicon film by using the silicon nitride film as a stopper. The next steps comprise forming a first resist film so as to cover a predetermined region of the polysilicon film, doping a first impurity of a first conductivity type to a predetermined depth of the silicon semiconductor substrate through the polysilicon film or the silicon nitride film by first ion implantation using the first resist film as a mask, doping a second impurity of the first conductivity type into the polysilicon film by second ion implantation using the first resist film as a mask, removing the first resist film and forming a second resist film so as to cover at least a region not covered with the first resist film, doping a third impurity of a second conductivity type to a predetermined depth of the silicon semiconductor substrate through the polysilicon film or the silicon nitride film by third ion implantation using the second resist film as a mask, doping a fourth impurity of the second conductivity type into the polysilicon film by fourth ion implantation using the second resist film as a mask, removing the second resist film and activating the first to fourth impurities by annealing, thereby forming a first substrate region of the first conductivity type and a second substrate region of the second conductivity type in the silicon semiconductor substrate. The next steps comprise making a portion of the polysilicon film in the upper side of the first substrate region have the first conductivity type, and making a portion of the polysilicon film in the upper of the second substrate region have the second conductivity type, partially removing the polysilicon film until an upper surface of the polysilicon film existing in each of the trenches becomes lower than a surface of the silicon semiconductor substrate, forming a third silicon oxide film on the polysilicon film remaining in each of the trenches, and removing the silicon nitride film.

A semiconductor device according to still another aspect of the present invention comprises a first trench formed in a first element isolation region on a semiconductor substrate, a first element activity region surrounded by the first element isolation region, a first insulating film covering inner walls of the first trench, a first conductive film formed on the first insulating film in the first trench. The first conductive film includes an impurity of a first conductivity type to serve as a first electrode for element isolation. A first well region is formed on the semiconductor substrate within the first element avtivity region and outside of the first trench, the first well region including an impurity of said first conductivity type. A second trench formed in a second element isolation region on the semiconductor substrate. The invention also comprises second element activity region surrounded by the second element isolation region, a second insulating film for covering inner walls of the second trench, a second conductive film formed on the second insulating film in the second trench, the second conductive film including an impurity of a second conductivity type opposite to the first conductivity type to serve as a second electrode for element isolation, and a second well region formed on the semiconductor substrate within the second element avtivity region and outside of the second trench, the second well region including an impurity of the second conductivity type.

A method of fabricating a semiconductor device according to still another aspect of the present invention comprises the steps of forming a first insulating film on a semiconductor substrate and patterning the first insulating film into a predetermined shape, forming a trench in the semiconductor substrate by using the first insulating film as an etching mask, forming a second insulating film on at least inner surfaces of the trench by using the first insulating film as a mask, forming a thin film capable of serving as a electric conductor on an entire surface of the semiconductor substrate including inner surfaces of the trench, substantially completely removing the thin film from the first insulating film by chemical mechanical polishing, and forming a thermal oxide film on the thin film remaining in the trench by using the first insulating film as a mask according to thermal oxidizing.

In the method of fabricating a semiconductor device of the present invention, it is possible to easily fabricate a buried field-shield element isolation structure having a shield-plate electrode of the same conductivity type as that of a substrate region or a gate electrode. This eliminates the need to form an enhancement impurity diffusion layer which is conventionally necessary. Since this simplifies the fabrication process, a semiconductor device can be manufactured at a low cost.

Also, well diffusion layers can be formed after trenches are formed in a substrate. This reliably prevents an electrically floated state of a well diffusion layer, which often occurs when a trench is formed in an element isolation region after the formation of the well diffusion layer because the trench is formed to extend through the well diffusion layer and the well diffusion layer is separated by the trench. Consequently, a semiconductor device with a high reliability can be fabricated.

Furthermore, ion implantation for forming a well diffusion layer and ion implantation for determining the conductivity type of a shield-plate electrode are continuously performed by using the same mask. Consequently, the masking step is simplified, and this further reduces the fabrication cost of a semiconductor device.

BRIEF DESCRIPTION OF THE DRAWINGS

FIGS. 2A to 2L are sectional views showing a semiconductor device fabrication method according to the second embodiment of the present invention in order of the fabrication steps;

DETAILED DESCRIPTION OF THE PREFERRED EMBODIMENTS

First Embodiment

The first embodiment of the present invention will be described below with reference to FIGS. 1A to 1K. In this embodiment, the structure of a MOS transistor and a method of fabricating the transistor will be explained in order of fabrication steps.

Figure 1A:
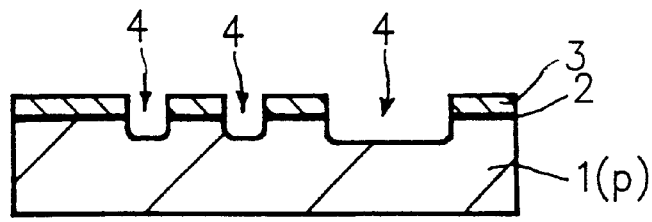
FIGS. 1A to 1L are sectional views showing a semiconductor device fabrication method according to the first embodiment of the present invention in order of the fabrication steps.

As shown in FIG. 1A, a thermal oxide film 2 is formed on the surface of a p-type silicon substrate 1. On the thermal oxide film 2, a silicon nitride film 3 is formed to have a film thickness of 100 to 500 nm by using, e.g., CVD. This silicon nitride film 3 is patterned by photolithography and dry etching to form openings in the silicon nitride film 3 in a region serving as an element isolation region.

This silicon nitride film 3 is used as a mask to dry-etch the silicon substrate 1 for forming trenches 4 having a depth of 300 to 500 nm in the p-type silicon substrate 1 in the region serving as an element isolation region.

Figure 1B:
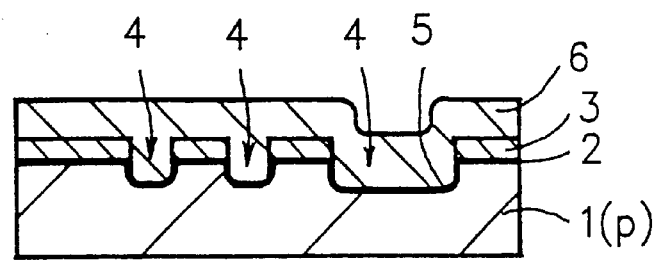

As shown in FIG. 1B, the silicon nitride film 3 is used as an oxidation-resistant mask to thermally oxidize the interior of the trenches 4 for forming a thermal oxide film 5 on the surfaces of the trenches 4. Subsequently, a polysilicon film 6 is deposited on the entire surface including the interior of the trenches 4 by using, e.g., CVD. The film thickness of this polysilicon film 6 is 0.6 to 1.2 $\mu$m, which is thicker than the sum of the film thickness of the silicon nitride film 3 and the depth of the trenches 4.

Figure 1C:
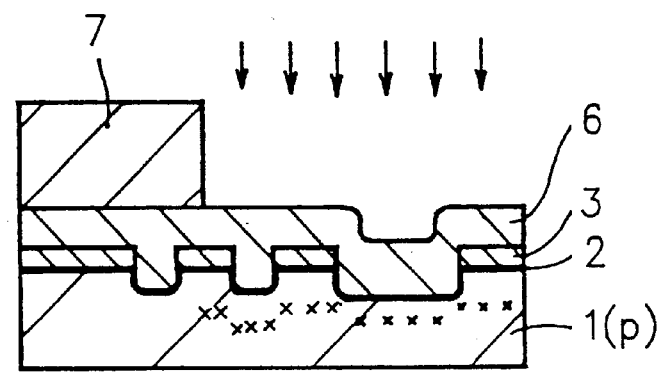

As shown in FIG. 1C, a region serving as an n-well is covered with a photoresist 7, and first ion implantation is performed to dope boron (B) into the p-type silicon substrate 1. The energy of this first ion implantation is, e.g., 600 kev to 2 Mev so that the implanted ions pass through the polysilicon film 6 and the silicon nitride film 3 to reach a predetermined depth in the p-type silicon substrate 1.

In this ion implantation, boron (B) is ion-implanted to a deeper position in the p-type silicon substrate 1 in portions immediately below the trenches 4 (particularly a portion immediately below the trench 4 having an opening diameter (width) not less than twice as large as the film thickness of the polysilicon film 6). This is so because the silicon nitride film 3 exists in portions besides the trenches 4 and the surface of the polysilicon film 6 is recessed over this wide trench 4. Accordingly, when a p-well diffusion layer is later formed by annealing, a well in the portion immediately below this trench 4 is ensured to be made deeper than the surrounding portion. This is also true of ion implantation of phosphorus (P) (to be described later) performed in the formation of an n-well diffusion layer. This reliably prevents an electrically floated state of a well due to split of the well by the trench, which often occurs in a case where a trench is formed after the formation of the well to extend beyond the well. This also obviates the need to deepen the well in view of processing margin of the trench. This facilitates shallow arrangement of wells when a well is formed in another well as in the case of a triple well configuration.

Figure 1D:
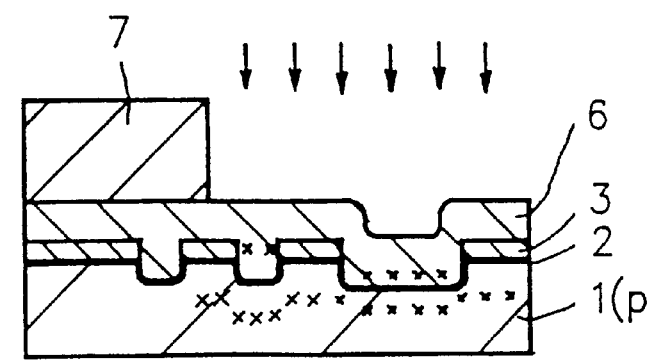

Subsequently, as shown in FIG. 1D, second ion implantation is performed by using the same photoresist 7 as in the first ion implantation as a mask, thereby doping boron (B) into the polysilicon film 6. The energy of this second ion implantation is, e.g., 200 to 500 keV so that the range of the implanted ions is in the polysilicon film 6.

Figure 1E:
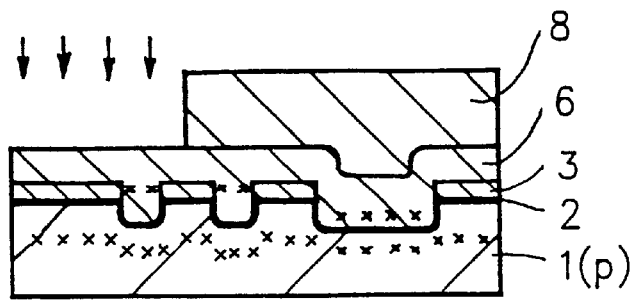

As shown in FIG. 1E, the photoresist 7 is removed, and at least a region which has not been covered with the photoresist 7, i.e., a region which has not been covered with the photoresist 7 and, if necessary, a portion of a region which has been covered with the photoresist 7 is covered with a photoresist 8. This photoresist 8 is used as a mask to perform third ion implantation for doping phosphorus (P) into the p-type silicon substrate 1. The energy of this third ion implantation is, e.g., 1 to 3 MeV so that the implanted ions pass through the polysilicon film 6 and the silicon nitride film 3 to reach a predetermined depth in the p-type silicon substrate 1. Furthermore, fourth ion implantation is performed by using the same photoresist 8 as a mask to dope phosphorus (P) into the polysilicon film 6. The energy of this fourth ion implantation is, e.g., 400 to 900 keV so that the range of the implanted ions is in the polysilicon film 6.

Figure 1F:
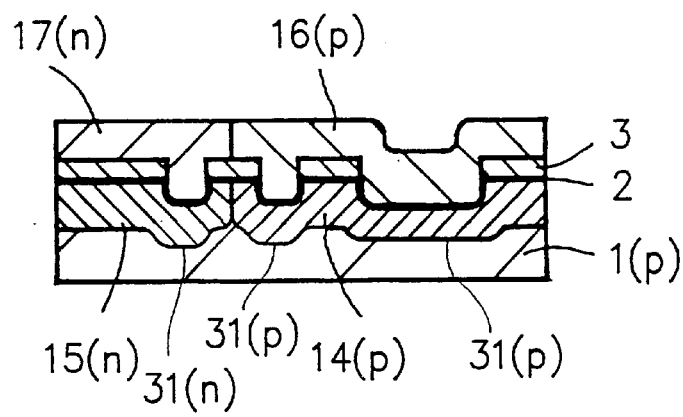

As shown in FIG. 1F, the photoresist 8 is removed, and annealing is performed to activate the ion-implanted impurities for forming a p-well diffusion layer 14 in the p-type silicon substrate 1 in the region into which boron (B) is doped by the first ion implantation and an n-well diffusion layer 15 in the p-type silicon substrate 1 in the region into which phosphorus (P) is doped by the third ion implantation. At the same time, the polysilicon film 6 on the p-well diffusion layer 14 is processed into a p-type polysilicon film 16, and the polysilicon film 6 on the n-well diffusion layer 15 is processed into an n-type polysilicon film 17. As described previously, in the p-well diffusion layer 14 and the n-well diffusion layer 15, junction portions 31 deeper than surroundings are formed immediately below the trenches 4.

Figure 1G:
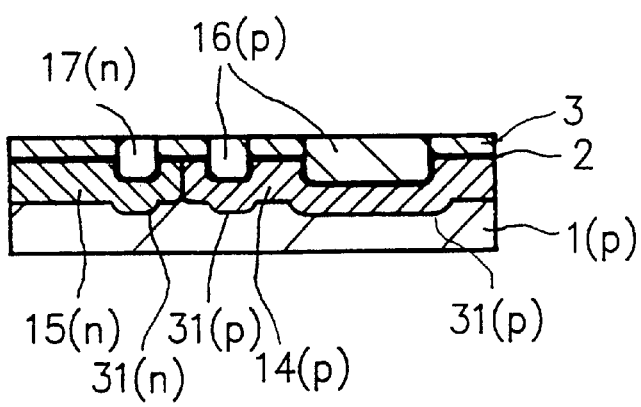

As shown in FIG. 1G, the silicon nitride film 3 is used as a stopper to planarize the p-type polysilicon film 16 and the n-type polysilicon film 17 by CMP (Chemical Mechanical Polishing).

Figure 1H:
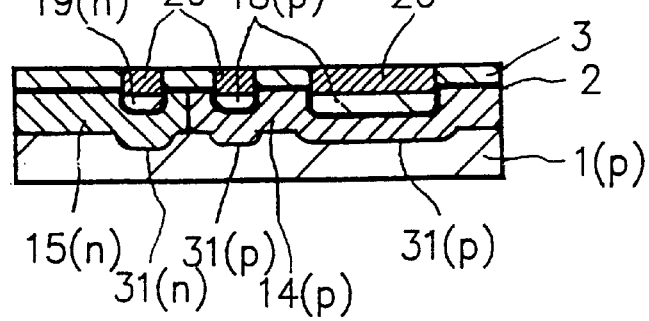

As shown in FIG. 1H, the silicon nitride film 3 is used as a mask to anisotropically etch the p-type polysilicon film 16 and the n-type polysilicon film 17 by, e.g., RIE (Reactive Ion Etching), thereby forming a p-type shield-plate electrode 18 and an n-type shield-plate electrode 19. The film thickness of each of these p- and n-type shield-plate electrodes 18 and 19 is 100 to 300 nm, which is thinner than the depth of the trenches 4.

Note that the steps of partially removing the p-type polysilicon film 16 and the n-type polysilicon film 17 shown in FIGS. 1G and 1H can also be continuously performed only by etching process.

Subsequently, a silicon oxide film 20 is deposited on the entire surface by, e.g., CVD, and planarized by CMP using the silicon nitride film 3 as a stopper.

Figure 1I:
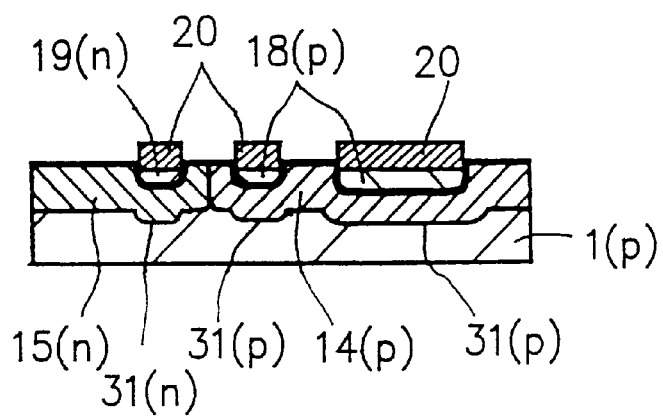

As shown in FIG. 1I, the silicon nitride film 3 is removed by wet etching using, e.g., ammonia water.

Figure 1J:
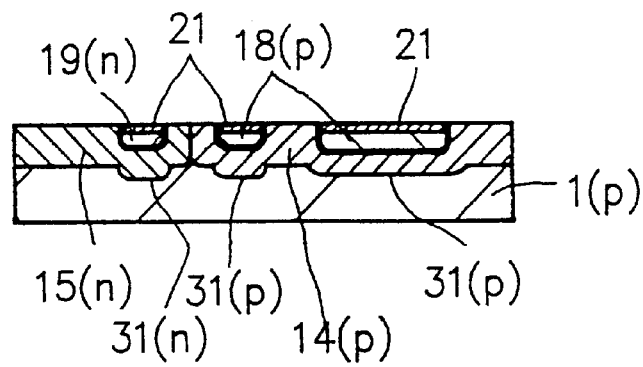

In FIG. 1J, the silicon oxide film 20 is planarized by CMP using the surface of the p-type silicon substrate 1 as a stopper to form a cap insulating film 21 of a field-shield element isolation structure.

Through the steps described above, a buried field-shield element isolation structure is formed.

Figure 1K:
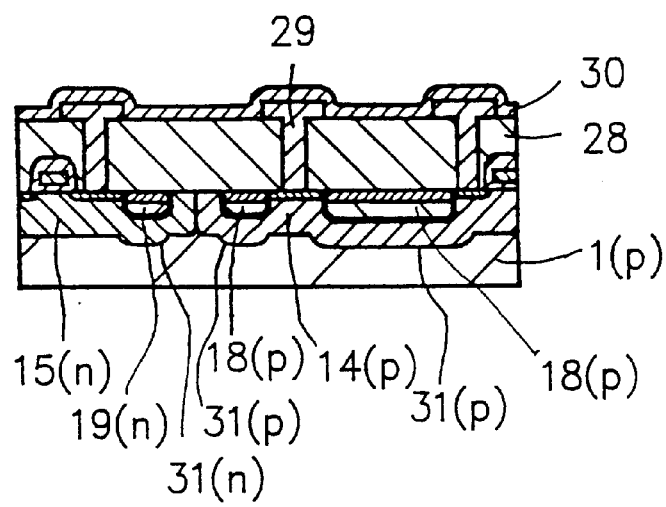

Thereafter, as shown in FIG. 1K, a transistor structure or the like is formed in each well region, and an insulating interlayer 28, metal interconnections 29, and a passivation film 30 are formed to complete the semiconductor device.

Figure 1L:
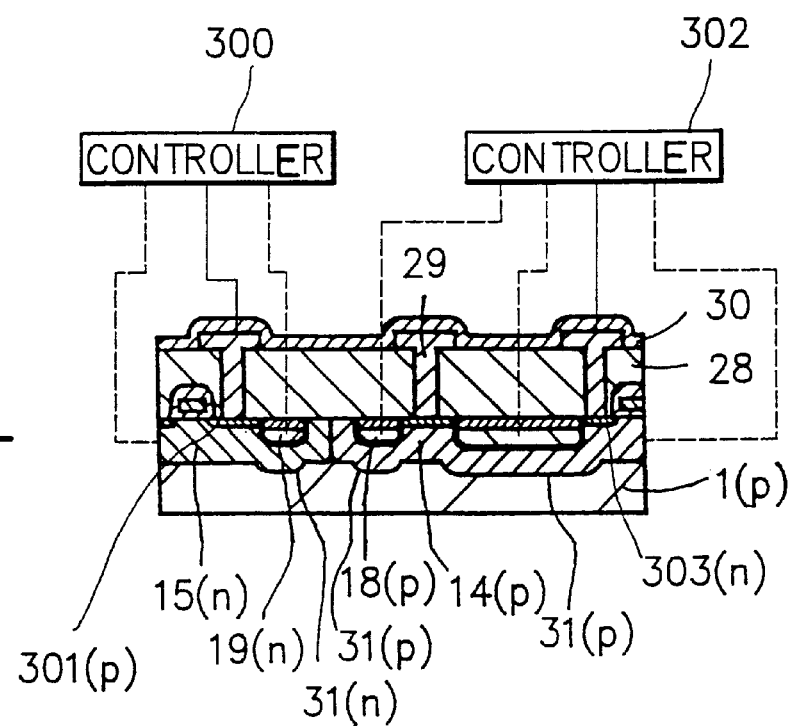

As shown in FIG. 1L, in order that the n-type shield-plate electrode 19 exhibits element isolation function, potential of the electrode 19 is set at the same potential as that of the n-well diffusion layer 15 or as that of a source region 301 of a p-channel type MOS transistor by controller 300. And in order that the p-type shield-plate electorde 18 exhibits element isolation function, potential of the electrode 18 is set at the same potential as that of p-well diffusion layer 14 or as that of a source region 303 of a n-channel type MOS transistor by controller 302.

In the first embodiment described above, the n-type shield-plate electrode 19 is formed in the region of the n-well diffusion layer 15, and the p-type shield-plate electrode 18 is formed in the region of the p-well diffusion layer 14. Consequently, inversion of the substrate region hardly occurs in each region. This eliminates the need for enhancement ion implantation for preventing a parasitic channel in the element isolation region.

Also, the ion implantation for forming a well diffusion layer and the ion implantation for determining the conductivity type of a shield-plate electrode are sequentially performed by using a common photoresist mask for each conductivity type. Consequently, a total of two photolithography steps, one step for each conductivity type, can be omitted.

Second Embodiment

The second embodiment of the present invention will be described below with reference to FIGS. 2A to 2K. In this embodiment, the structure of a MOS transistor and a method of fabricating the transistor will be explained in order of fabrication steps.

Figure 2A:
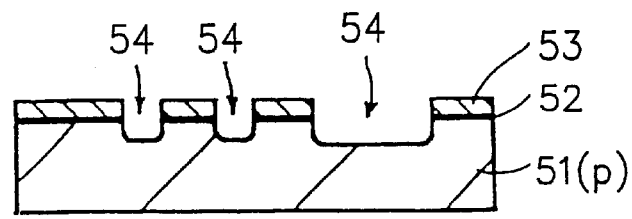

As shown in FIG. 2A, a thermal oxide film 52 is formed on the surface of a p-type silicon substrate 51. On the thermal oxide film 52, a silicon nitride film 53 is formed to have a film thickness of 100 to 500 nm by using, e.g., CVD. This silicon nitride film 53 is patterned by photolithography and dry etching to form openings in the silicon nitride film 53 in a region serving as an element isolation region.

This silicon nitride film 53 is used as a mask to dry-etch the silicon substrate 51 for forming trenches 54 having a depth of 300 to 500 nm in the p-type silicon substrate 51 in the region serving as an element isolation region.

Figure 2B:
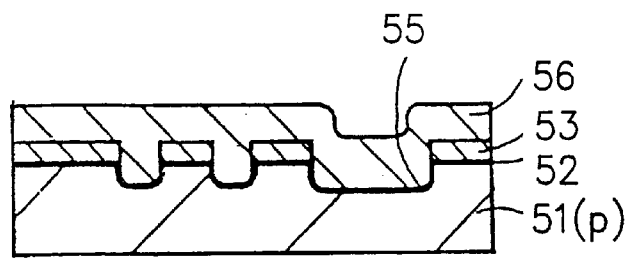

As shown in FIG. 2B, the silicon nitride film 53 is used as an oxidation-resistant mask to thermally oxidize the interior of the trenches 54 for forming a thermal oxide film 55 on the surfaces of the trenches 54. Subsequently, a polysilicon film 56 is deposited on the entire surface including the interior of the trenches 54 by using, e.g., CVD. The film thickness of this polysilicon film 56 is 0.6 to 1.2 $\mu$m, which is thicker than the sum of the film thickness of the silicon nitride film 53 and the depth of the trenches 54.

Figure 2C:
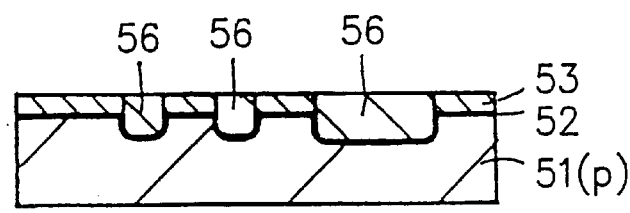

As shown in FIG. 2C, the silicon nitride film 53 is used as a stopper to planarize the polysilicon film 56 by CMP.

Figure 2D:
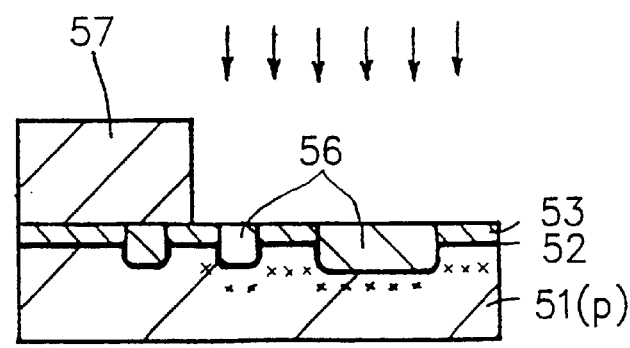

As shown in FIG. 2D, a region serving as an n-well is covered with a photoresist 57, and first ion implantation is performed to dope boron (B) into the p-type silicon substrate 51. The energy of this first ion implantation is, e.g., 150 kev to 1 MeV so that the implanted ions pass through the polysilicon film 56 or the silicon nitride film 53 to reach a predetermined depth in the p-type silicon substrate 51.

In this ion implantation, boron (B) is ion-implanted to a deeper position in the p-type silicon substrate 51 in portions immediately below the trenches 54 because the silicon nitride film 53 exists in portions besides the trenches 54. Accordingly, when a p-well diffusion layer is later formed by annealing, a well in the portion immediately below this trench 54 is ensured to be made deeper than the surrounding portion. This is also true of ion implantation of phosphorus (P) (to be described later) performed in the formation of an n-well diffusion layer. This reliably prevents an electrically floated state of a well due to split of the well by the trench, which often occurs in a case where a trench is formed after the formation of the well to extend beyond the well. This also obviates the need to deepen the well in view of processing margin of the trench. This facilitates shallow arrangement of wells when a well is formed in another well as in the case of a triple well configuration.

Subsequently, as shown in FIG. 2E, second ion implantation is performed by using the same photoresist 57 as in the first ion implantation as a mask, thereby doping boron (B) into the polysilicon film 56 in the trenches 54. The energy of this second ion implantation is, e.g., 50 to 200 kev so that the range of the implanted ions is in the polysilicon film 56.

As shown in FIG. 2F, the photoresist 57 is removed, and at least a region which has not been covered with the photoresist 57, i.e., a region which has not been covered with the photoresist 57 and, if necessary, a portion of a region which has been covered with the photoresist 57 is covered with a photoresist 58. This photoresist 58 is used as a mask to perform third ion implantation for doping phosphorus (P) into the p-type silicon substrate 51. The energy of this third ion implantation is, e.g., 400 keV to 2 MeV so that the implanted ions pass through the polysilicon film 56 or the silicon nitride film 53 to reach a predetermined depth in the p-type silicon substrate 51. Furthermore, fourth ion implantation is performed by using the same photoresist 58 as a mask to dope phosphorus (P) into the polysilicon film 56. The energy of this fourth ion implantation is, e.g., 100 to 600 keV so that the range of the implanted ions is in the polysilicon film 56.

As shown in FIG. 2G, the photoresist 58 is removed, and annealing is performed to activate the ion-implanted impurities for forming a p-well diffusion layer 64 in the p-type silicon substrate 51 in the region into which boron (B) is doped by the first ion implantation and an n-well diffusion layer 65 in the p-type silicon substrate 51 in the region into which phosphorus (P) is doped by the third ion implantation. At the same time, the polysilicon film 56 on the p-well diffusion layer 64 is processed into a p-type polysilicon film 66, and the polysilicon film 56 on the n-well diffusion layer 65 is processed into an n-type polysilicon film 67. As described previously, in the p-well diffusion layer 64 and the n-well diffusion layer 65, junction portions 81 deeper than surroundings are formed immediately below the trenches 54.

As shown in FIG. 2H, the silicon nitride film 53 is used as a mask to anisotropically etch the p-type polysilicon film 66 and the n-type polysilicon film 67 by, e.g., RIE, thereby forming a p-type shield-plate electrode 68 and an n-type shield-plate electrode 69. The film thickness of each of these p- and n-type shield-plate electrodes 68 and 69 is 100 to 300 nm, which is thinner than the depth of the trenches 54.

Subsequently, a silicon oxide film 70 is deposited on the entire surface by, e.g., CVD, and planarized by CMP using the silicon nitride film 53 as a stopper.

Figure 2I:
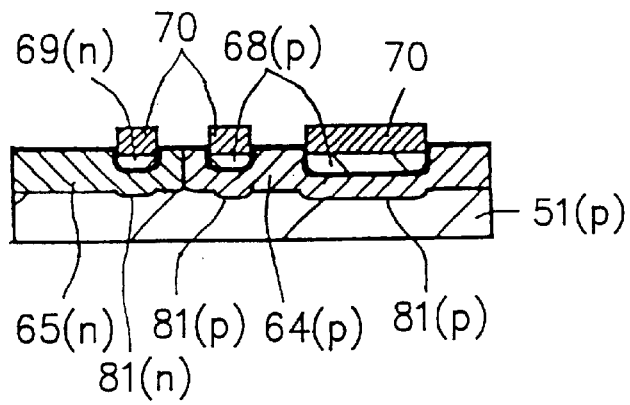

As shown in FIG. 2I, the silicon nitride film 53 is removed by wet etching using, e.g., ammonia water.

Figure 2J:
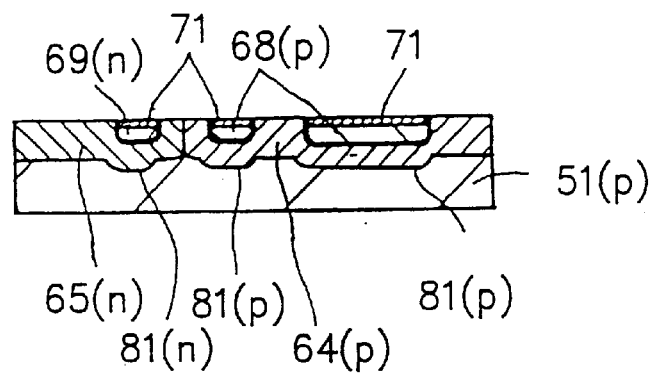

In FIG. 2J, the silicon oxide film 70 is planarized by CMP using the surface of the p-type silicon substrate 51 as a stopper to form a cap insulating film 71 of a field-shield element isolation structure.

Figure 2K:
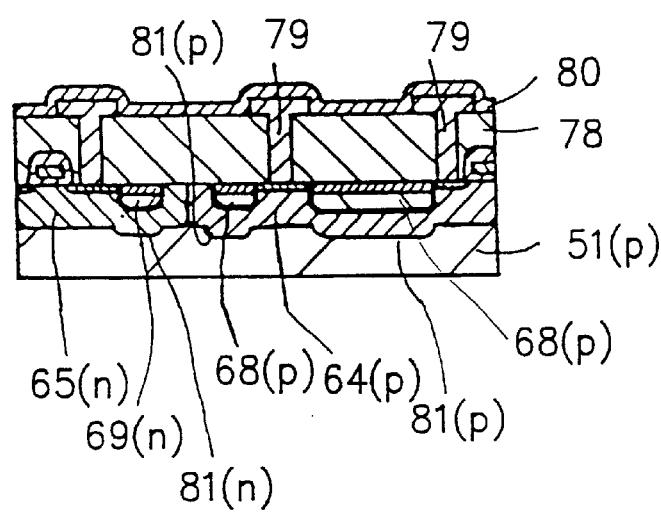

Thereafter, as shown in FIG. 2K, a transistor structure or the like is formed in each well region, and an insulating interlayer 78, metal interconnections 79, and a passivation film 80 are formed to complete the semiconductor device.

Figure 2L:
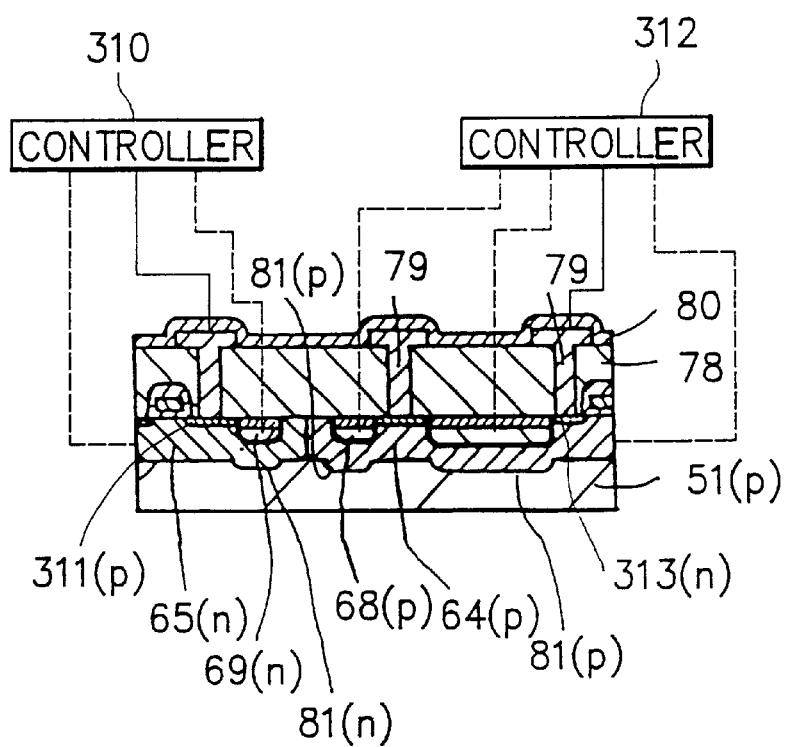

As shown in FIG. 2L, in order that the n-type shield-plate electrode 69 exhibits element isolation function, potential of the electrode 69 is set at the same potential as that of the n-well diffusion layer 65 or as that of a source region 311 of a p-channel type MOS transistor by controller 310. And in order that the p-type shield-plate electorde 68 exhibits element isolation function, potential of the electrode 68 is set at the same potential as that of p-well diffusion layer 64 or as that of a source region 313 of a n-channel type MOS transistor by controller 312.

This second embodiment has the same effects as the first embodiment described above and also has the effect of being able to perform each ion implantation with a lower energy than in the first embodiment, since each ion implantation is performed after the polysilicon film 56 is planarized.

Third Embodiment

The third embodiment of the present invention will be described below with reference to FIGS. 3A to 3K. In this embodiment, the structure of a MOS transistor and a method of fabricating the transistor will be explained in order of fabrication steps.

Figure 3A:
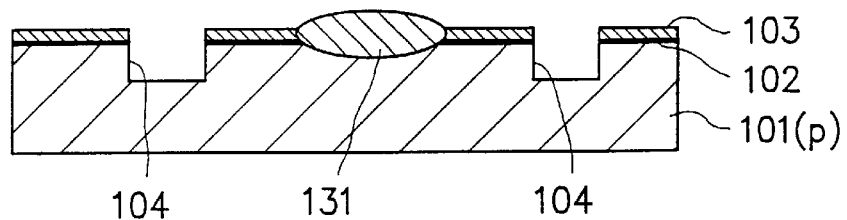
FIGS. 3A to 3K are sectional views showing a semiconductor device fabrication method according to the third embodiment of the present invention in order of the fabrication steps.

As shown in FIG. 3A, a field oxide film 131 is formed as an element isolation structure on the surface of a p-type silicon substrate 101 by, e.g., LOCOS, thereby defining an element formation region on the p-type silicon substrate 101. As the element isolation structure, a field-shield element isolation structure can also be suitably formed instead of the field oxide film 131.

A thermal oxide film 102 is formed on the surface of the element formation region of the p-type silicon substrate 101. On the thermal oxide film 102, a silicon nitride film 103 is formed to have a film thickness of 100 to 500 nm by using, e.g., CVD. This silicon nitride film 103 is patterned by photolithography and dry etching to form openings in the silicon nitride film 3 in regions where gate electrodes are to be formed.

This silicon nitride film 103 is used as a mask to dry-etch the silicon substrate 101 for forming trenches 104 having a depth of 300 to 500 nm in the p-type silicon substrate 101 in the regions where gate electrodes are to be formed.

Figure 3B:
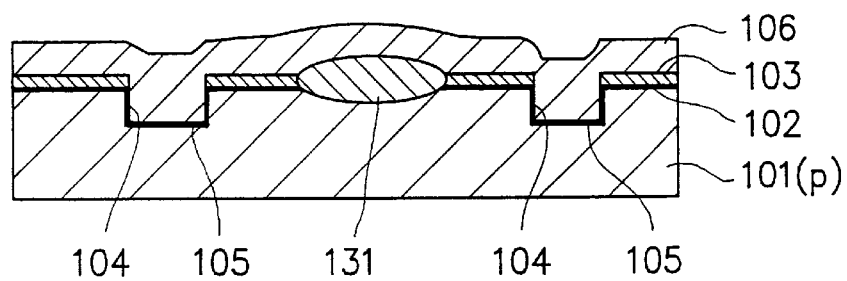

As shown in FIG. 3B, the silicon nitride film 103 is used as an oxidation-resistant mask to thermally oxidize the interior of the trenches 104 for forming a thermal oxide film 105 on the surfaces of the trenches 104. Subsequently, a polysilicon film 106 is deposited on the entire surface including the interior of the trenches 104 by using, e.g., CVD. The film thickness of this polysilicon film 106 is 0.6 to 1.2 $\mu$m, which is thicker than the sum of the film thickness of the silicon nitride film 103 and the depth of the trenches 104.

Figure 3C:
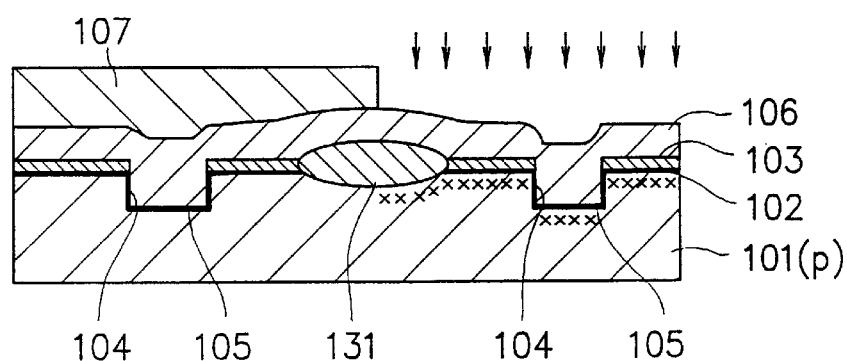

As shown in FIG. 3C, a region serving as an n-well is covered with a photoresist 107, and first ion implantation is performed to dope boron (B) into the p-type silicon substrate 101. The energy of this first ion implantation is, e.g., 600 keV to 2 MeV so that the implanted ions pass through the polysilicon film 106 and the silicon nitride film 103 to reach a predetermined depth in the p-type silicon substrate 101.

In this ion implantation, boron (B) is ion-implanted to a deeper position in the p-type silicon substrate 101 in portions immediately below the trenches 104, because the silicon nitride film 103 exists in portions besides the trenches 104 and the surface of the polysilicon film 106 is recessed over the trenches 104. Accordingly, when a p-well diffusion layer is later formed by annealing, wells in the portions immediately below these trenches 104 are ensured to be made deeper than the surrounding portion. This is also true of ion implantation of phosphorus (P) (to be described later) performed in the formation of an n-well diffusion layer. This reliably prevents an electrically floated state of a well due to split of the well by the trench, which often occurs in a case where a trench is formed after the formation of the well to extend beyond the well. This also obviates the need to deepen the well in view of processing margin of the trench. This facilitates shallow arrangement of wells when a well is formed in another well as in the case of a triple well configuration.

Figure 3D:
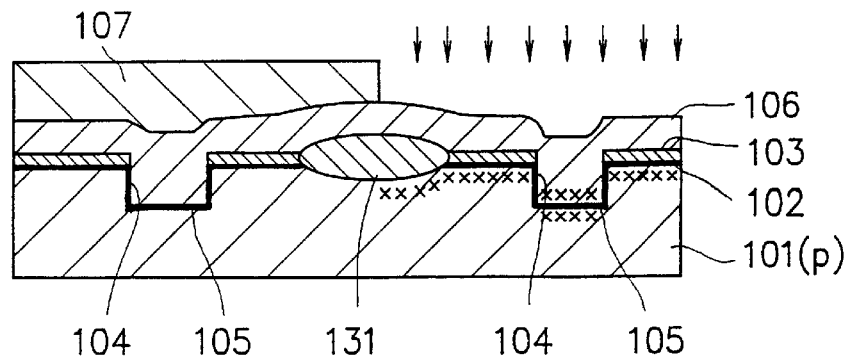

Subsequently, as shown in FIG. 3D, second ion implantation is performed by using the same photoresist 107 as in the first ion implantation as a mask, thereby doping boron (B) into the polysilicon film 106. The energy of this second ion implantation is, e.g., 200 to 500 kev so that the range of the implanted ions is in the polysilicon film 106.

Figure 3E:
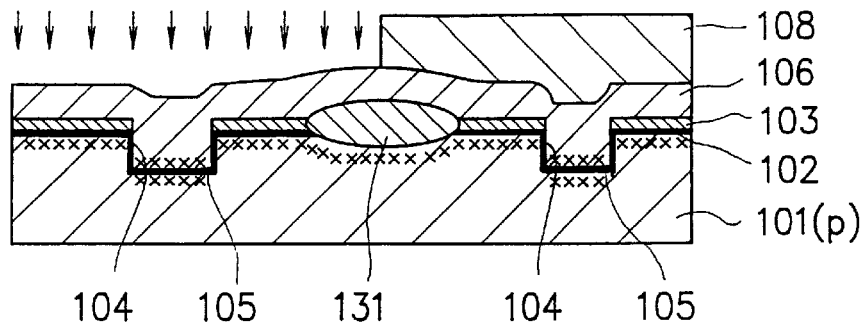

As shown in FIG. 3E, the photoresist 107 is removed, and at least a region which has not been covered with the photoresist 107, i.e., a region which has not been covered with the photoresist 107 and, if necessary, a portion of a region which has been covered with the photoresist 107, is covered with a photoresist 108. This photoresist 108 is used as a mask to perform third ion implantation for doping phosphorus (P) into the p-type silicon substrate 101. The energy of this third ion implantation is, e.g., 1 to 3 MeV so that the implanted ions pass through the polysilicon film 106 and the silicon nitride film 103 to reach a predetermined depth in the p-type silicon substrate 101. Furthermore, fourth ion implantation is performed by using the same photoresist 108 as a mask to dope phosphorus (P) into the polysilicon film 106. The energy of this fourth ion implantation is, e.g., 400 to 900 kev so that the range of the implanted ions is in the polysilicon film 106.

Figure 3F:
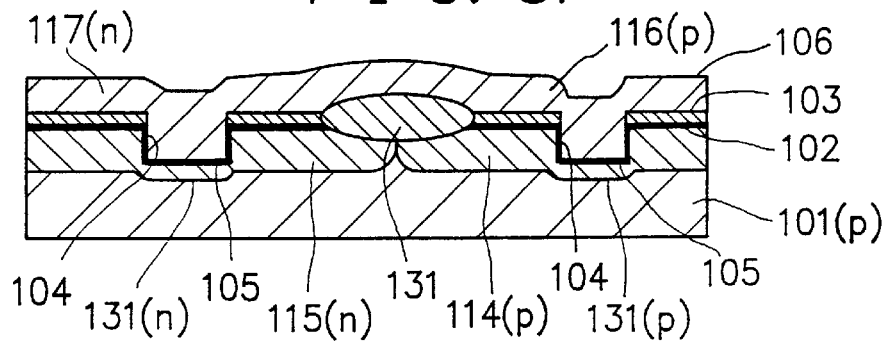

As shown in FIG. 3F, the photoresist 108 is removed, and annealing is performed to activate the ion-implanted impurities for forming a p-well diffusion layer 114 in the p-type silicon substrate 101 in the region into which boron (B) is doped by the first ion implantation and an n-well diffusion layer 115 in the p-type silicon substrate 101 in the region into which phosphorus (P) is doped by the third ion implantation. At the same time, the polysilicon film 106 on the p-well diffusion layer 114 is processed into a p-type polysilicon film 116, and the polysilicon film 106 on the n-well diffusion layer 115 is processed into an n-type polysilicon film 117. As described previously, in the p-well diffusion layer 114 and the n-well diffusion layer 115, junction portions 131 deeper than surroundings are formed immediately below the trenches 104.

Figure 3G:
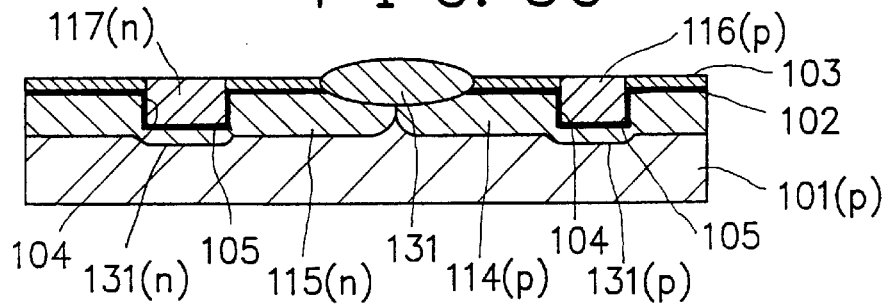

As shown in FIG. 3G, the silicon nitride film 103 is used as a stopper to planarize the p-type polysilicon film 116 and the n-type polysilicon film 117 by CMP.

Figure 3H:
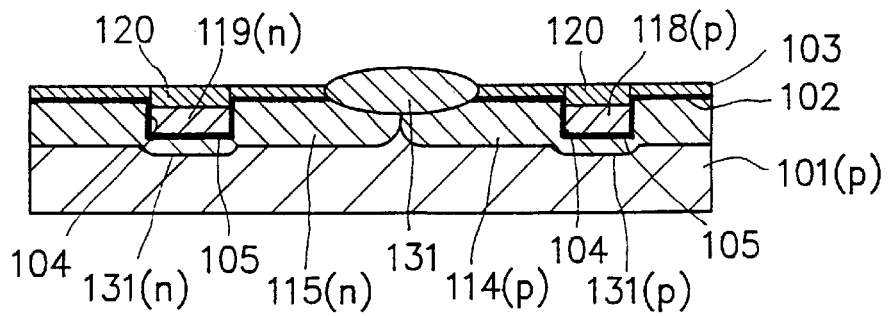

As shown in FIG. 3H, the silicon nitride film 103 is used as a mask to anisotropically etch the p-type polysilicon film 116 and the n-type polysilicon film 117 by, e.g., RIE, thereby forming a p-type gate electrode 118 and an n-type gage electrode 119. The film thickness of each of these p- and n-type gate electrodes 118 and 119 is 100 to 300 nm, which is thinner than the depth of the trenches 104.

Note that the steps of partially removing the p-type polysilicon film 116 and the n-type polysilicon film 117 shown in FIGS. 3G and 3H can also be continuously performed only by etching process.

Subsequently, a silicon oxide film 120 is deposited on the entire surface by, e.g., CVD, and planarized by CMP using the silicon nitride film 103 as a stopper.

Figure 3I:
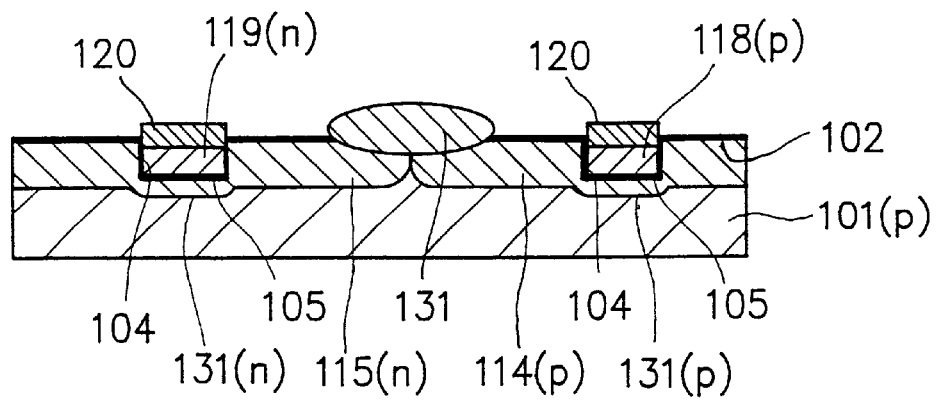

As shown in FIG. 3I, the silicon nitride film 103 is removed by wet etching using, e.g., ammonia water.

Figure 3J:
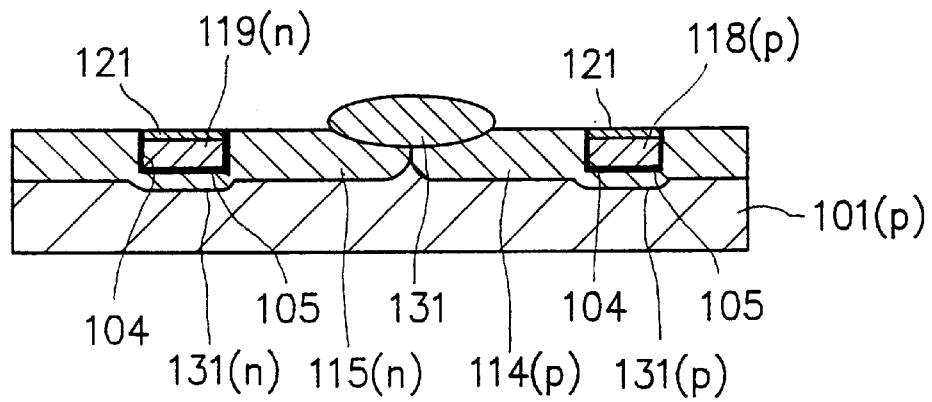

In FIG. 3J, the silicon oxide film 120 is planarized by CMP using the surface of the p-type silicon substrate 101 as a stopper to form a cap insulating film 121 for the p-type gate electrode 118 and the n-type gate electrode 119.

Subsequently, the n-well diffusion layer 115 is covered with a photoresist (not shown), and ion implantation is performed by using the cap insulating film 121 on the p-type gate electrode 118 as a mask to dope phosphorus (P) into the p-well diffusion layer 114 on both sides of the p-type gate electrode 118. The energy of this ion implantation is, e.g., 10 to 60 keV so that the ion implantation has almost no effect on the p-type gate electrode 118. Subsequently, the above photoresist is removed, and the p-type well diffusion layer 114 is covered with a photoresist (not shown). Ion implantation is performed by using the cap insulating film 121 on the n-type gate electrode 119 as a mask to dope boron (B) into the n-type well diffusion layer 115 on both sides of the n-type gate electrode 119. The energy of this ion implantation is, e.g., 5 to 30 keV so that the ion implantation has almost no effect on the n-type gate electrode 119.

Figure 3K:
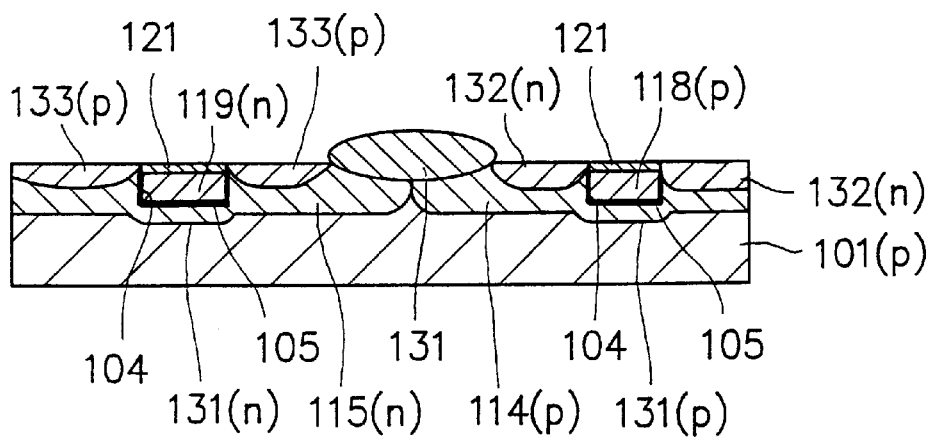

Thereafter, the above photoresist is removed, and annealing is performed to activate the ion-implanted impurities, thereby forming, as shown in FIG. 3K, a pair of n-type impurity diffusion layers 132 serving as a source and a drain on both sides of the p-type gate electrode 118 and a pair of p-type impurity diffusion layers 133 serving as a source and a drain on both sides of the n-type gate electrode 119.

Through the steps described above, a buried MOS transistor is formed.

Thereafter, a transistor structure or the like is formed in each well region, and an insulating interlayer, metal interconnections, a passivation film, and the like (not shown) are formed to complete the semiconductor device.

In the third embodiment described above, the n-type gate electrode 119 is formed in the region of the n-well diffusion layer 115, and the p-type gate electrode 118 is formed in the region of the p-well diffusion layer 114. Consequently, the work function difference between the gate electrode and the well diffusion layer is decreased. This eliminates the need for enhancement ion implantation for preventing a parasitic channel.

Also, the ion implantation for forming a well diffusion layer and the ion implantation for determining the conductivity type of a gate electrode are sequentially performed by using a common photoresist mask for each conductivity type. Consequently, a total of two photolithography steps, one step for each conductivity type, can be omitted.

Fourth Embodiment

The fourth embodiment of the present invention will be described below with reference to FIGS. 4A to 4J. In this embodiment, the structure of a MOS transistor and a method of fabricating the transistor will be explained in order of fabrication steps.

Figure 4A:
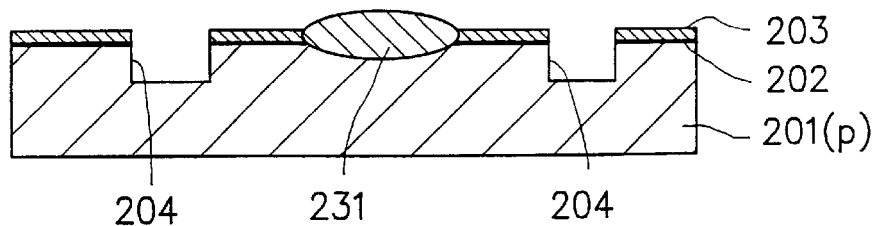
FIGS. 4A to 4J are sectional views showing a semiconductor device fabrication method according to the fourth embodiment of the present invention in order of the fabrication steps.

As shown in FIG. 4A, a field oxide film 231 is formed as an element isolation structure on the surface of a p-type silicon substrate 201 by, e.g., LOCOS, thereby defining an element formation region on the p-type silicon substrate 201. As the element isolation structure, a field-shield element isolation structure can also be suitably formed instead of the field oxide film 231.

A thermal oxide film 202 is formed on the surface of the element formation region of the p-type silicon substrate 201. On the thermal oxide film 202, a silicon nitride film 203 is formed to have a film thickness of 100 to 500 nm by using, e.g., CVD. This silicon nitride film 203 is patterned by photolithography and dry etching to form openings in the silicon nitride film 203 in regions where gate electrodes are to be formed.

This silicon nitride film 203 is used as a mask to dry-etch the silicon substrate 201 for forming trenches 204 having a depth of 300 to 500 nm in the p-type silicon substrate 201 in the regions where gate electrodes are to be formed.

Figure 4B:
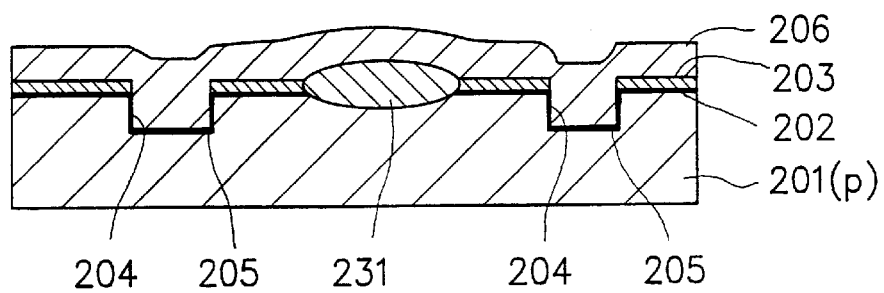

As shown in FIG. 4B, the silicon nitride film 203 is used as an oxidation-resistant mask to thermally oxidize the interior of the trenches 204 for forming a thermal oxide film 205 on the surfaces of the trenches 204. Subsequently, a polysilicon film 206 is deposited on the entire surface including the interior of the trenches 204 by using, e.g., CVD. The film thickness of this polysilicon film 206 is 0.6 to 1.2 μm, which is thicker than the sum of the film thickness of the silicon nitride film 203 and the depth of the trenches 204.

Subsequently, the silicon nitride film 203 is used as a stopper to planarize the polysilicon film 206 by CMP.

Figure 4C:
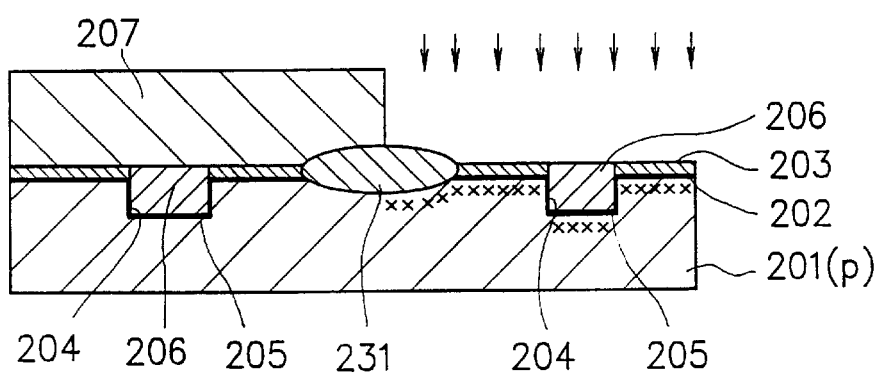

As shown in FIG. 4C, a region serving as an n-well is covered with a photoresist 207, and first ion implantation is performed to dope boron (B) into the p-type silicon substrate 201. The energy of this first ion implantation is, e.g., 150 keV to 1 MeV so that the implanted ions pass through the polysilicon film 206 or the silicon nitride film 203 to reach a predetermined depth in the p-type silicon substrate 201.

In this ion implantation, boron (B) is ion-implanted to a deeper position in the p-type silicon substrate 201 in portions immediately below the trenches 204 because the silicon nitride film 203 exists in portions besides the trenches 204. Accordingly, when a p-well diffusion layer is later formed by annealing, wells in the portions immediately below these trenches 204 are ensured to be made deeper than the surrounding portion. This is also true of ion implantation of phosphorus (P) (to be described later) performed in the formation of an n-well diffusion layer. This reliably prevents an electrically floated state of a well due to split of the well by the trench, which often occurs in a case where a trench is formed after the formation of the well to extend beyond the well. This also obviates the need to deepen the well in view of processing margin of the trench. This facilitates shallow arrangement of wells when a well is formed in another well as in the case of a triple well configuration.

Figure 4D:
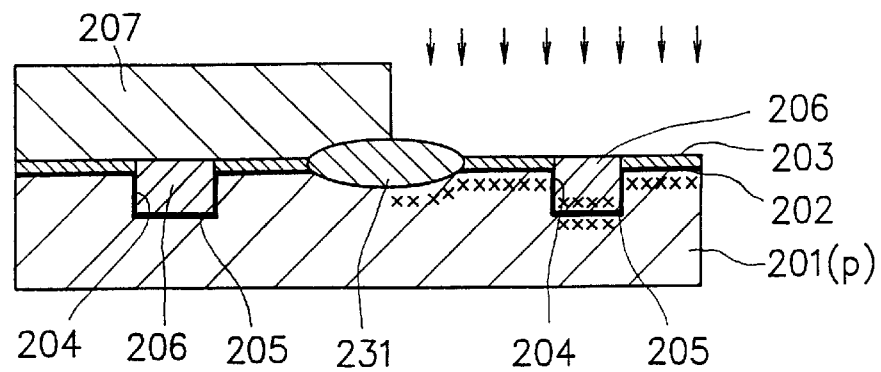

Subsequently, as shown in FIG. 4D, second ion implantation is performed by using the same photoresist 207 as in the first ion implantation as a mask, thereby doping boron (B) into the polysilicon film 206 in the trenches 204.

The energy of this second ion implantation is, e.g., 50 to 200 keV so that the range of the implanted ions is in the polysilicon film 206.

Figure 4E:
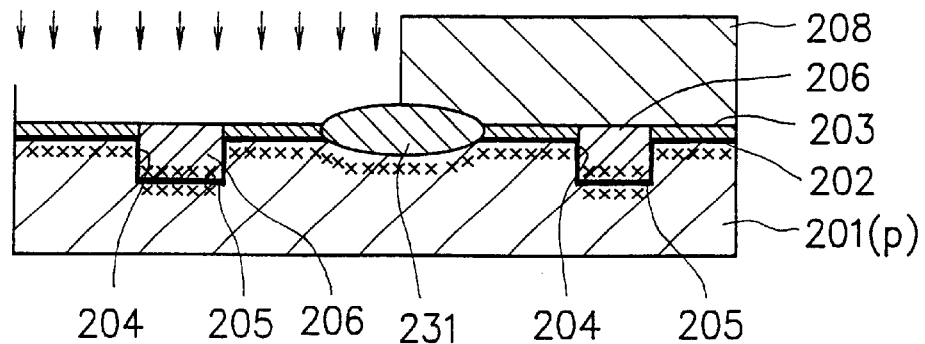

As shown in FIG. 4E, the photoresist 207 is removed, and at least a region which has not been covered with the photoresist 207, i.e., a region which has not been covered with the photoresist 207 and, if necessary, a portion of a region which has been covered with the photoresist 207, is covered with a photoresist 208. This photoresist 208 is used as a mask to perform third ion implantation for doping phosphorus (P) into the p-type silicon substrate 201. The energy of this third ion implantation is, e.g., 400 keV to 2 MeV so that the implanted ions pass through the polysilicon film 206 or the silicon nitride film 203 to reach a predetermined depth in the p-type silicon substrate 201. Furthermore, fourth ion implantation is performed by using the same photoresist 208 as a mask to dope phosphorus (P) into the polysilicon film 206. The energy of this fourth ion implantation is, e.g., 100 to 600 keV so that the range of the implanted ions is in the polysilicon film 206.

Figure 4F:
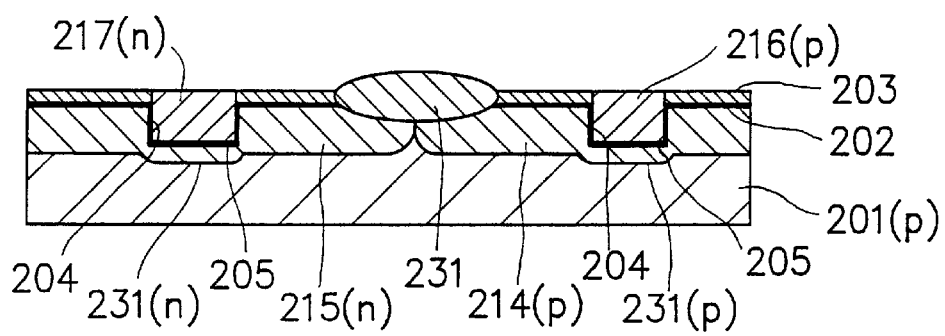

As shown in FIG. 4F, the photoresist 208 is removed, and annealing is performed to activate the ion-implanted impurities for forming a p-well diffusion layer 214 in the p-type silicon substrate 201 in the region into which boron (B) is doped by the first ion implantation and an n-well diffusion layer 215 in the p-type silicon substrate 201 in the region into which phosphorus (P) is doped by the third ion implantation. At the same time, the polysilicon film 206 on the p-well diffusion layer 214 is processed into a p-type polysilicon film 216, and the polysilicon film 206 on the n-well diffusion layer 215 is processed into an n-type polysilicon film 217. As described previously, in the p-well diffusion layer 214 and the n-well diffusion layer 215, junction portions 231 deeper than surroundings are formed immediately below the trenches 204.

Figure 4G:
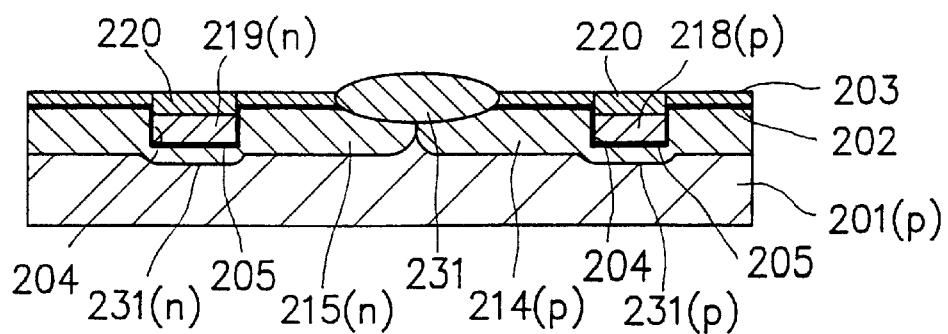

As shown in FIG. 4G, the silicon nitride film 203 is used as a mask to anisotropically etch the p-type polysilicon film 216 and the n-type polysilicon film 217 by, e.g., RIE, thereby forming a p-type gate electrode 218 and an n-type gate electrode 219. The film thickness of each of these p- and n-type gate electrodes 218 and 219 is 100 to 300 nm, which is thinner than the depth of the trenches 204.

Subsequently, a silicon oxide film 220 is deposited on the entire surface by, e.g., CVD, and planarized by CMP using the silicon nitride film 203 as a stopper.

Figure 4H:
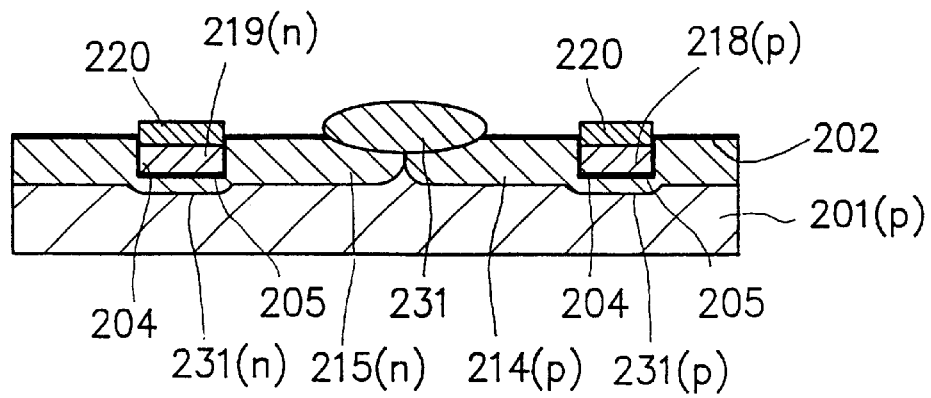

As shown in FIG. 4H, the silicon nitride film 203 is removed by wet etching using, e.g., ammonia water.

Figure 4I:
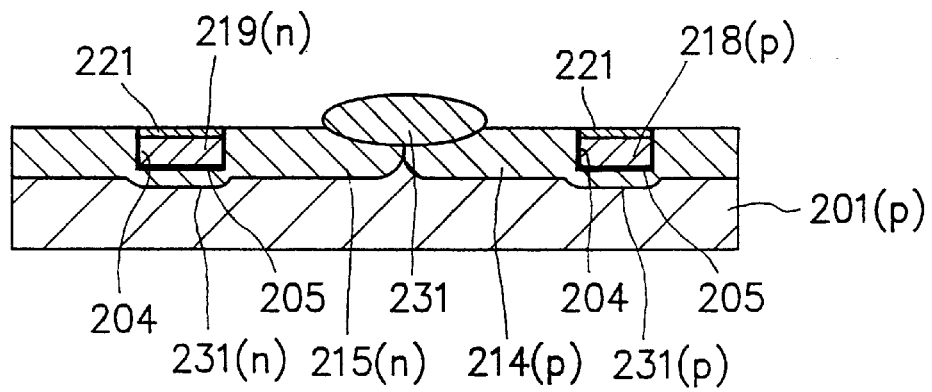

In FIG. 4I, the silicon oxide film 220 is planarized by CMP using the surface of the p-type silicon substrate 201 as a stopper to form a cap insulating film 221 for the p-type gate electrode 218 and the n-type gate electrode 219. Subsequently, the n-well diffusion layer 215 is covered with a photoresist (not shown), and ion implantation is performed by using the cap insulating film 221 on the p-type gate electrode 218 as a mask to dope phosphorus (P) into the p-well diffusion layer 214 on both sides of the p-type gate electrode 218. The energy of this ion implantation is, e.g., 10 to 60 kev so that the ion implantation has almost no effect on the p-type gate electrode 218. Subsequently, the above photoresist is removed, and the p-type well diffusion layer 214 is covered with a photoresist (not shown). Ion implantation is performed by using the cap insulating film 221 on the n-type gate electrode 219 as a mask to dope boron (B) into the n-type well diffusion layer 215 on both sides of the n-type gate electrode 219. The energy of this ion implantation is, e.g., 5 to 30 keV so that the ion implantation has almost no effect on the n-type gate electrode 219.

Figure 4J:
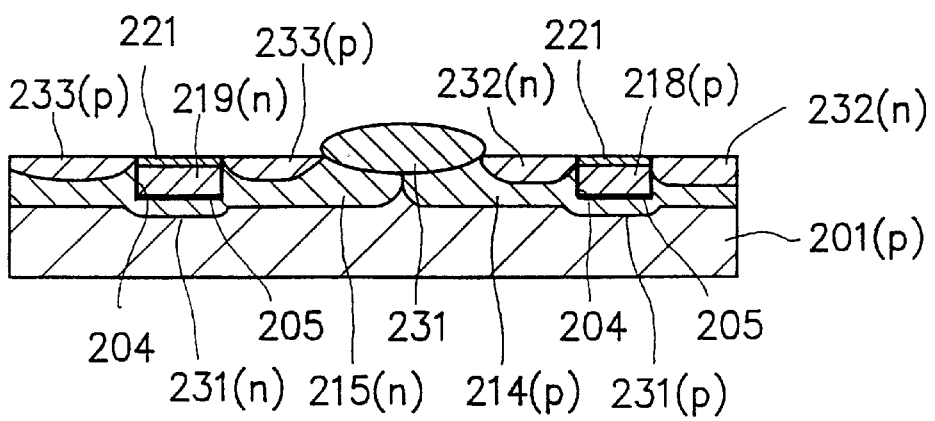

Thereafter, the above photoresist is removed, and annealing is performed to activate the ion-implanted impurities, thereby forming, as shown in FIG. 4J, a pair of n-type impurity diffusion layers 232 serving as a source and a drain on both sides of the p-type gate electrode 218 and a pair of p-type impurity diffusion layers 233 serving as a source and a drain on both sides of the n-type gate electrode 219.

Through the steps described above, a buried MOS transistor is formed.

Thereafter, a transistor structure or the like is formed in each well region, and an insulating interlayer, metal interconnections, a passivation film, and the like (not shown) are formed to complete the semiconductor device.

This fourth embodiment has the same effects as the third embodiment described above and also has the effect of being able to perform each ion implantation with lower energy than in the first embodiment, since each ion implantation is performed after the polysilicon film 206 is planarized.

In the present invention, it is possible to easily fabricate a buried field-shield element isolation structure having a shield-plate electrode of the same conductivity type as that of a substrate region. This eliminates the need to form an enhancement impurity diffusion layer which is conventionally necessary. Since this simplifies the fabrication process, a semiconductor device can be manufactured at a low cost.

Also, well diffusion layers can be formed after trenches are formed in a substrate. This reliably prevents an electrically floated state of a well diffusion layer due to split of the well by the trench, which often occurs in a case where a trench is formed in an element isolation region after the formation of the well to extend beyond the well diffusion layer. Consequently, a semiconductor device with a high reliability can be fabricated.

Furthermore, ion implantation for forming a well diffusion layer and ion implantation for determining the conductivity type of a shield-plate electrode are sequentially performed by using a common mask. Consequently, the masking step is simplified, and this further reduces the fabrication cost of a semiconductor device.

What is claimed is:

1. A method of fabricating a semiconductor device comprising the steps of:

forming a trench in a semiconductor substrate by using a selective etching process;

forming an insulating layer at least on the inner surface of said trench;

forming a film containing silicon at least on said insulation layer in said trench;

doping a first impurity of a first conductivity type by a first ion implantation to a depth of said semiconductor substrate at least through said film containing silicon, wherein said first impurity doped into said semiconductor substrate by said first ion implantation is at a level deeper than the bottom of said trench, doping a second impurity of the first conductivity type by a second ion implantation into said film containing silicon;

activating the first and second impurities by annealing said semiconductor substrate to form a substrate region of the first conductivity type in said semiconductor substrate and to make said film containing silicon to have the first conductivity type;

then forming said semiconductor substrate doped with said first impurity into a well diffusion layer; and forming said film containing silicon doped with said second impurity into a gate or field shield electrode within said trench.

2. A method according to claim 1, further comprising the steps of:

forming a first resist film to cover a region of said film containing silicon;

doping said first impurity of said first conductivity type to a depth in said semiconductor substrate through said film containing silicon by said first ion implantation using said first resist film as a mask; and doping said second impurity of said first conductivity type in said film containing silicon by said second ion implantation using said first resist film as a mask.

3. A method of fabricating a semiconductor device comprising the steps of:

forming a trench in a semiconductor substrate by using a selective etching process;

forming an insulating layer at least on the inner surface of said trench;

forming a film containing silicon at least on said insulation layer in said trench;

doping a first impurity of a first conductivity type by a first ion implantation to a depth of said semiconductor substrate at least through said film containing silicon, wherein said first impurity doped into said semiconductor substrate by said first ion implantation is at a level deeper than the bottom of said trench, then forming said semiconductor substrate doped with said first impurity into a well diffusion layer;

forming a nitride film on said semiconductor substrate and patterning said nitride film into a shape; and forming said trench in said semiconductor substrate by using said nitride film as an etching mask, wherein said step of forming said film containing silicon further comprises the steps of:

forming said film containing silicon on said nitride film to cover inside of said trench; and polishing the surface of said film containing silicon by a chemical mechanical polishing process by using said nitride film as a stopper in a step to remove said film containing silicon on said nitride film.

4. A method according to claim 3, further comprising the steps of:

forming a cap insulation film on said film containing silicon in said trench; and thereafter, removing said nitride film.

5. A method of fabricating a semiconductor device comprising the steps of:

forming a trench in a semiconductor substrate by using a selective etching process;

forming an insulating layer at least on the inner surface of said trench;

forming a film containing silicon at least on said insulation layer in said trench;

doping a first impurity of a first conductivity type by a first ion implantation to a depth of said semiconductor substrate at least through said film containing silicon, wherein said first impurity doped into said semiconductor substrate by said first ion implantation is at a level deeper than the bottom of said trench, forming a first resist film to cover a predetermined region of said film containing silicon;

doping said first impurity of said first conductivity type to a depth in said semiconductor substrate through said film containing silicon by said first ion implantation using said first resist film as a mask, forming a second resist film after removing said first resist film to cover at least a region not covered with said first resist film;

doping a third impurity of the second conductivity type to a depth in said semiconductor substrate through said film containing silicon by a third ion implantation using said second resist film as a mask; and forming said semiconductor substrate doped with said first and third impurities into well diffusion layers, respectively.

6. A method according to claim 5, further comprising the steps of:

doping a fourth impurity of the second conductivity type in said film containing silicon by a fourth ion implantation using said second resist film as a mask; and removing said second resist film.

7. A method of fabricating a semiconductor device comprising the steps of:

forming a first insulation film on a semiconductor substrate, and patterning said first insulation film into a predetermined shape;

forming a trench by using said first insulating film as an etching mask;

forming a second insulation film at least on the inner surface of said trench;

forming a thin film capable of being conductive on the entire surface of said semiconductor substrate including inside of said trench;

polishing said thin film capable of being conductive by a chemical mechanical polishing process; and forming said thin film capable of being conductive into a gate or field shield electrode within said trench.

8. A method according to claim 7, further comprising a step of forming a thermal oxidation film on said thin film capable of being conductive and remained inside the trench, by a thermal oxidation process using said first insulation film as a mask.

9. A method according to claim 7, further comprising a step of forming said insulation film with an insulation film containing a nitride film.

10. A method according to claim 7, further comprising a step of forming said film capable of being conductive with a thin film containing silicon.

11. A method according to claim 7, further comprising a step of forming said trench in said semiconductor substrate to demarcate an element active region.

12. A method of fabricating a semiconductor device comprising the steps of:

forming a trench in a semiconductor substrate by using a selective etching process; and forming a well having one of P and N conductivity type on a surface region of said semiconductor substrate so that said well extends in the semiconductor substrate at least below said trench and the region of said well below the trench extends deeper than the well region in the peripheral region of the trench, forming a thin film inside said trench through said first insulating layer; and doping an impurity having the same conductivity type as that of said well region into said thin film capable of being conductive; and forming said thin film doped with said impurity into a gate or field shield electrode within said trench.

13. A method according to claim 12, further comprising a step of forming said thin film capable of being conductive with a silicon film.

14. A method of fabricating a semiconductor device comprising the steps of:

forming a first and a second trench in a semiconductor substrate by using selective etching process;

forming a P-type well and an N-type well in a surface region of said semiconductor substrate;

forming said P-type well so that said P-type well extends in the semiconductor substrate at least below said first trench and the region of said P-type well below the first trench extends deeper than the P-type well region in the peripheral region of the first trench;

forming said N-type well so that said N-type well extends in the semiconductor substrate at least below said second trench and the region of said N-type well below the second trench extends deeper than the N-type well region in the peripheral region of the second trench; and forming a P-type conductive film on an insulating film within said first trench to fill said first trench, and forming an N-type conductive film on an insulating film within said second trench to fill said second trench.

15. A method according to claim 16, further comprising the steps of:

forming a first insulation film inside said first trench;

forming a second insulation film inside said second trench;

forming silicon films inside said trenches through said first and second insulation films; and doping an impurity into said silicon films.

16. A method according to claim 14, further comprising a step of forming said first and second trenches at a depth of about 300 nm to about 500 nm from the surface of the semiconductor substrate.

17. A method according to claim 14, further comprising the steps of:

forming said first trench in said semiconductor substrate to demarcate a first element active region; and forming said second trench in said semiconductor substrate to demarcate a second element active region.

18. A method according to claim 15, further comprising the steps of:

doping a P-type impurity into said silicon film in said first trench; and doping an N-type impurity into said silicon film in said second trench.

* * * * *